United States Patent [19]
Masumura et al.

[11] Patent Number: 5,914,053
[45] Date of Patent: Jun. 22, 1999

[54] APPARATUS AND METHOD FOR DOUBLE-SIDED POLISHING SEMICONDUCTOR WAFERS

[75] Inventors: Hisashi Masumura; Kiyoshi Suzuki; Hideo Kudo, all of Fukushima-ken, Japan

[73] Assignee: Shin-Etsu Handotai Co., Ltd., Tokyo, Japan

[21] Appl. No.: 08/748,833

[22] Filed: Nov. 14, 1996

[30] Foreign Application Priority Data

Nov. 27, 1995 [JP] Japan .................................. 7-307903

[51] Int. Cl.⁶ .............................. C23F 1/02; H01L 21/302
[52] U.S. Cl. ............................................... 216/88; 156/345
[58] Field of Search ................... 438/691; 216/88; 156/345

[56] References Cited

U.S. PATENT DOCUMENTS

| | | | |
|---|---|---|---|
| 4,588,473 | 5/1986 | Hisatomi et al. | 156/645 |
| 5,110,764 | 5/1992 | Ogino | 437/224 |
| 5,316,620 | 5/1994 | Hasegawa et al. | 156/645 |

FOREIGN PATENT DOCUMENTS

| | | |
|---|---|---|
| 0393951 | 10/1990 | European Pat. Off. . |
| 0552989 | 7/1993 | European Pat. Off. . |
| 57-177641 | 11/1982 | Japan . |
| 58-4349 | 1/1983 | Japan . |
| 58-59559 | 4/1983 | Japan . |
| 58-149169 | 9/1983 | Japan . |
| 58-171824 | 10/1983 | Japan . |
| 60-249568 | 12/1985 | Japan . |
| 7-226618 | 8/1995 | Japan . |

OTHER PUBLICATIONS

J. Haisma et al., "Improved Geometry of Double–Sided Polished Parallel Wafers Prepared for Direct Wafer Bonding", *Applied Optics*, vol. 33, No. 34, Dec. 1, 1994, pp. 7945–7954.

*Primary Examiner*—Benjamin Utech
*Assistant Examiner*—George Goudreau
*Attorney, Agent, or Firm*—Oliff & Berridge, PLC

[57] ABSTRACT

In double-side polishing of semiconductor wafers, not only the two main surfaces but also the surface of the edge portion can be polished in one operation with cost reduction and freedom from contamination. An apparatus with twin polishing turn tables is used in the double-side polishing and the inner peripheral edge of each carrier hole formed in a wafer carrier is profiled such that the sectional profile of the inner peripheral edge is substantially the copy of the edge of the wafer placed in the hole.

20 Claims, 4 Drawing Sheets

APPARATUS AND METHOD FOR DOUBLE-SIDED POLISHING SEMICONDUCTOR WAFERS

TECHNICAL FIELD

This invention relates to an apparatus for double-side polishing semiconductor wafers with which not only the two sides but also the edge of each of the semiconductor wafers can be polished at the same time, a method for double-side polishing semiconductor wafers using the same apparatus, and a double-side polished semiconductor wafer produced by means of the same method.

BACKGROUND ART

An apparatus 22 for double-side polishing semiconductor wafers as shown in FIGS. 4 to 7, wherein only the main functional members are shown in FIG. 4, is well known as an apparatus for polishing the two sides of each of semiconductor wafers W at the same time.

The apparatus 22 shown in FIG. 4 comprises a lower polishing turn table 24 and upper polishing turn table 26 both of which are arranged in a face to face relation with each other. Lower and upper polishing pads 24a, 26a are fixedly applied on the upper face of the lower polishing turn table 24 and the lower face of the upper polishing turn table 26 respectively. The lower and upper polishing turn tables 24, 26 are respectively rotated in opposed directions by a driving means which is not shown for clarity.

A sun gear 28 is at the center of the lower polishing turn table 24 and held on the surface thereof and an internal gear 30 in an annular shape is located near the outside of the periphery thereof. Each of wafer carriers 32 has the shape of a disc and lies between the upper surface of the lower polishing pad 24a and the lower surface of the upper polishing pad 26a. The wafer carriers 32 are moved around in a space between the lower and upper polishing pads 24a, 26a, while each of the wafer carriers 32 turns not only about its own center but revolves around the centers of the polishing pads 24a, 26a by the actions of the sun gear 28 and internal gear 30. Each of the carriers 32 has a plurality of carrier holes 34 and semiconductor wafers W to be polished are placed in the respective carrier holes 34. In polishing the wafers W, polishing slurry is supplied between a wafer W and each of the polishing pads 24a, 26a through a hole 38 communicating between the upper and lower surfaces of the upper polishing turn table 26 from a nozzle 36. As a wafer carrier 32 turns about its center and at the same time revolves around the centers of the lower and upper polishing turn tables 24, 26, the wafers W placed in the carrier holes 34 turn about the respective centers of their own and at the same time revolve around not only the centers of the polishing turn tables 24, 26 but also the center of the carrier 32, so that the wafers W are moved around between the lower and upper polishing pads 24a, 26a and the two sides of each wafer W are polished at the same time.

The inner peripheral edge of a carrier hole 34 has an annular member A secured along the same edge for the purpose of preventing cracking or chipping of the edge of a semiconductor wafer W. The annular member A is produced by injection molding of plastics or it may be produced from glass fiber reinforced epoxy resin composite. Structures similar to or same as the wafer carrier 32 including the annular member A are respectively disclosed in laid open publications of Japanese Utility Model Application No. 57-177641, 58-4349 and 58-59559, and laid open publication of Japanese Patent Application No. 6-226618.

When double-side polishing of a semiconductor wafer W is conducted by the use of the conventional apparatus 22 for double-side polishing semiconductor wafers above mentioned, a surface of a peripheral portion of an edge of the wafer W can be polished by the function of an annular member A as a polishing buff because of a relative rotational speed of the wafer W to the carrier hole 34 due to the rotation of the wafer W within the carrier hole 34, but the upper and lower chamfered portion of the edge of the wafer W remain unpolished. Therefore, generation of particles from such portion of the edge of the wafer W cannot be prevented in the conventional double-side polishing operation. In light of the problem, it is required that the whole edge portions are polished in double-side polishing. There are additional other problems in realizing the perfect polishing of the whole edge portions in double-side polishing that the perfect edge polishing as an additional process step is a costly operation because of its technical difficulty and moreover, the main surfaces of the wafer W are contaminated during edge polishing process.

SUMMARY OF THE INVENTION

In consideration of the problems unsolved in the art, this invention was made. This invention has objects to provide an apparatus and method for double-side polishing semiconductors with which whole edge portions of each of the wafers are polished at almost the same time during the time when the two main surfaces of the wafer are polished at the same time, production cost is thereby reduced, and the main surfaces of the wafer are polished with no contamination and a third object to provide a double-side polished semiconductor wafer produced by the method.

This invention is directed to an apparatus for double-side polishing semiconductor wafers, which comprises lower and upper polishing turn tables with two polishing pads applied fixedly on the directly opposed surfaces of the turn tables and wafer carriers lying between the opposed surfaces of the polishing pads, each of which wafer carriers has carrier holes, in which holes the wafers are respectively placed, wherein the two sides of each of the wafers are polished at the same time by rotation of the lower and upper polishing turn tables, characterized in that a sectional profile of the inner peripheral edge of each of the carrier holes is substantially a copy of the edge of the wafer to be polished.

A sectional profile of the inner peripheral edge of each of the carrier holes is a curve having various curvatures combined. For example, the upper half of the curve bends with curvatures near that of a circle and the lower half bends with curvatures larger than those of the upper portion, the upper half being almost vertically positioned and the lower half being gradually tailing off in height toward the center of the carrier hole. There may be provided on the inner peripheral edge of a carrier hole an annular polishing buff with the sectional profile of the inner peripheral edge being substantially a copy of the edge of a semiconductor wafer to be polished. A sectional profile of the lower part of the polishing buff is preferably designed so as to gradually tail off in height toward the center of the carrier hole. The annular polishing buff can be made of one of materials for a polishing buff such as polyurethane foam.

According to a method of this invention using the apparatus above mentioned, the whole surface of the edge of each of semiconductor wafers are polished in substantially one operation during the time when the two main surfaces of the wafer are polished at the same time.

When a semiconductor wafer is polished using the method above mentioned, a wafer carrier is always located on the upper surface of the lower polishing turn table by the action of gravitational force and the lower half of the edge of the wafer is in contact with the inner peripheral edge of the carrier hole or in another case, the inner peripheral edge of the annular polishing buff. In a first stage of double-side polishing, a lower half of the edge of the wafer is polished by a rotational speed of the wafer relative to the carrier hole. In a second stage, the wafer is turned upside down to polish the upper half of the edge. Double-side polishing of the two main surfaces of the wafer is finished when the two stages above mentioned are complete.

This invention is directed to a method for double-side polishing semiconductor wafers using an apparatus for double-side polishing semiconductor wafers above mentioned, which preferably comprises the step of turning upside down each of the semiconductor wafers in the middle of one polishing operation for polishing the two sides of the wafer at the same time.

This invention is directed to a semiconductor wafer with the two main surfaces and all edge portions of the wafer being polished by the method for double-side polishing semiconductor wafers above mentioned.

BRIEF DESCRIPTION OF THE DRAWINGS

The novel features which are considered characteristic of this invention are set forth with particularity in the appended claims. This invention itself, however, and additional objects and advantages thereof will be best understood from the following description of embodiments thereof when read in connection with the accompanying drawings, in which:

DETAILED DESCRIPTION OF THE INVENTION

Examples of this invention will be described below in reference to FIGS. 1 to 3, where the parts or members in FIGS. 1 to 3 which are the same as or similar to those in FIGS. 4 to 7 are indicated at the same marks as those in FIGS. 4 to 7.

Figure 4:
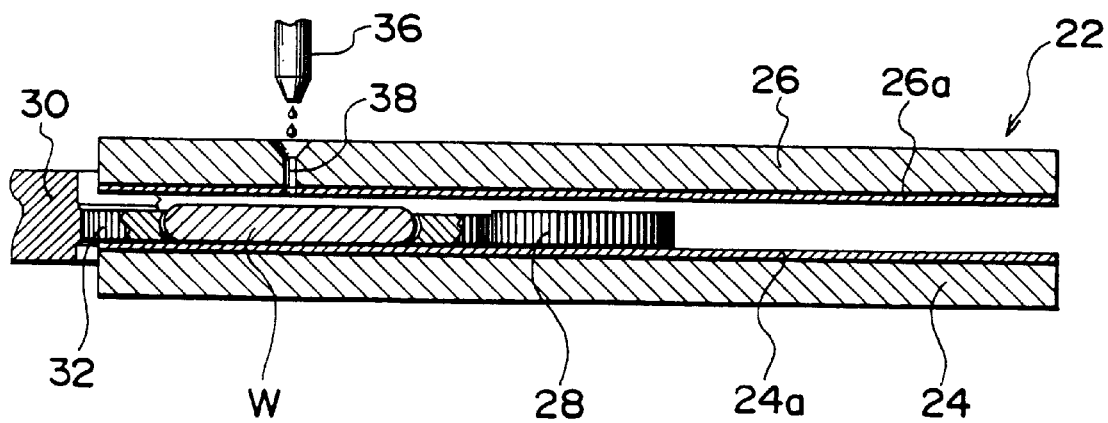
FIG. 4 is a schematic sectional view illustrating the main functional members of a conventional apparatus for double-side polishing semiconductor wafers.
Figure 5:
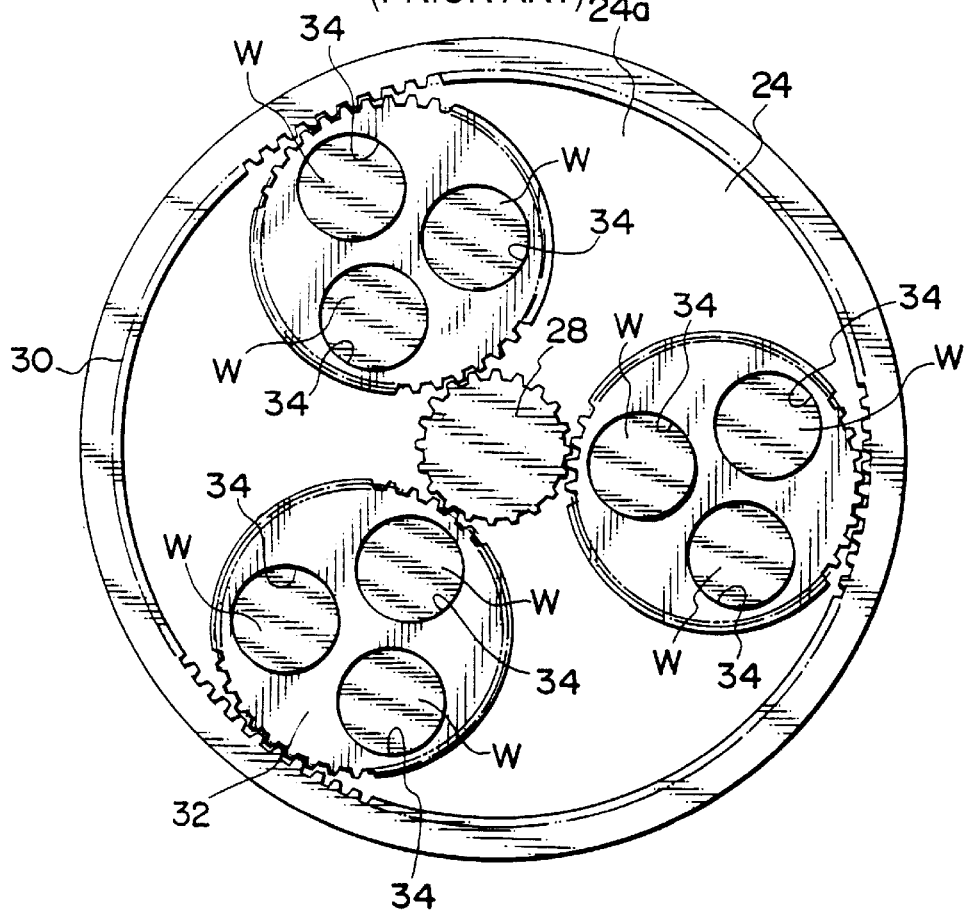
FIG. 5 is a schematic plan view of the main functional members for illustration when the upper polishing turn table is removed off together with its accessories in the conventional apparatus shown in FIG. 4.
Figure 6:
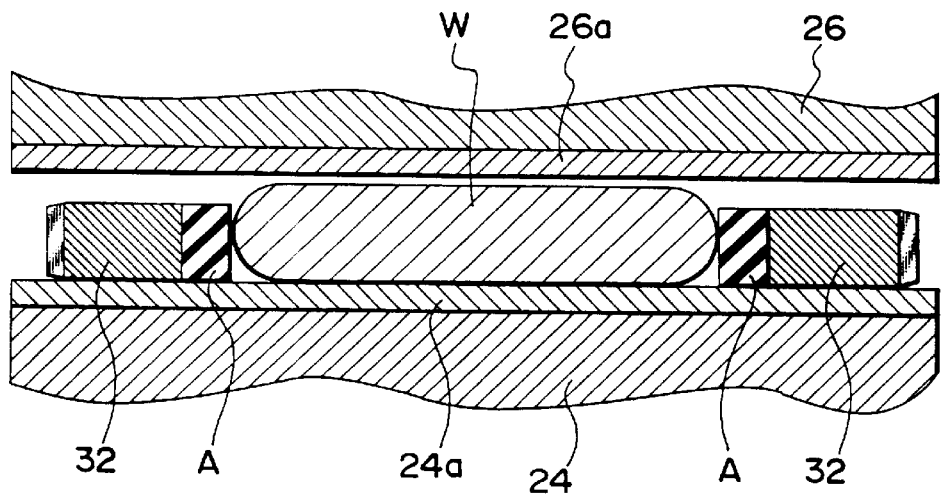
FIG. 6 is a schematic enlarged sectional view of the main part of the apparatus shown in FIG. 4.
Figure 7:
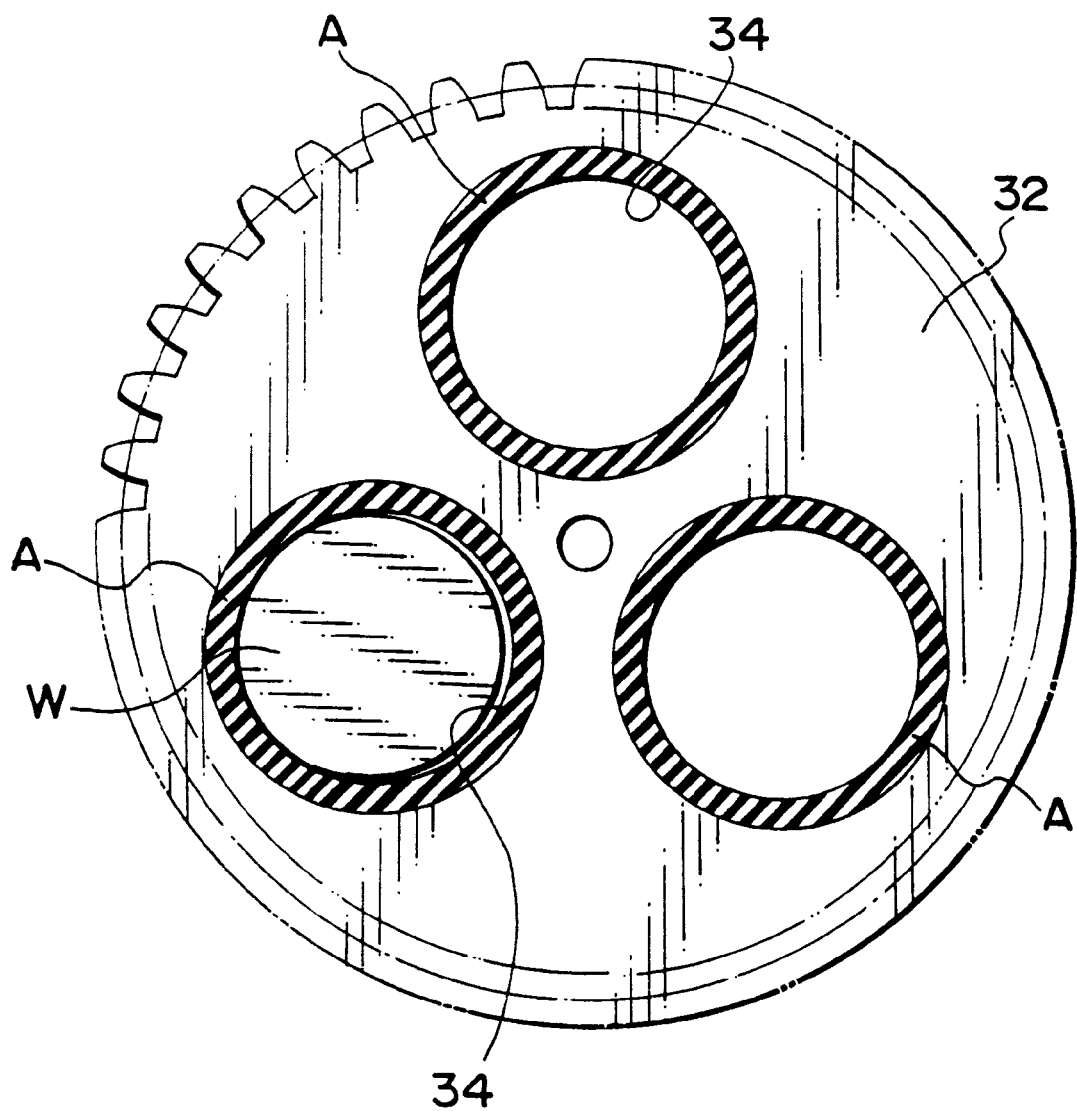
FIG. 7 is a schematic plan view of a wafer carrier used in the main part of the conventional apparatus shown in FIG. 4.

The basic structure of the apparatus for double-side polishing semiconductor wafers according to this invention is substantially the same as the structure of the conventional apparatus shown in FIGS. 4 and 5.

Figure 1:
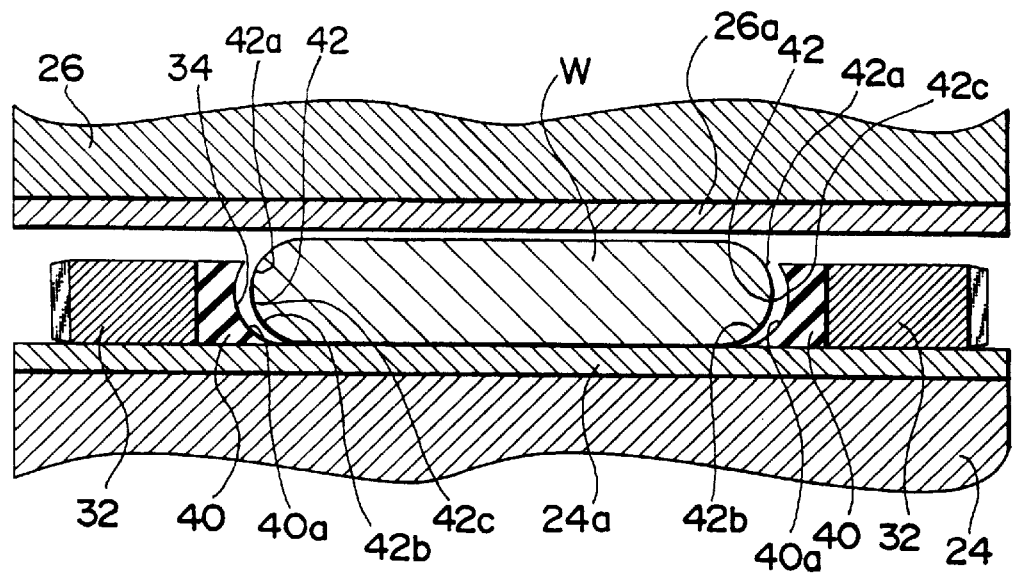
FIG. 1 is a schematic enlarged sectional view of an example of the main part of an apparatus for double-side polishing semiconductor wafers according to this invention.
Figure 2:
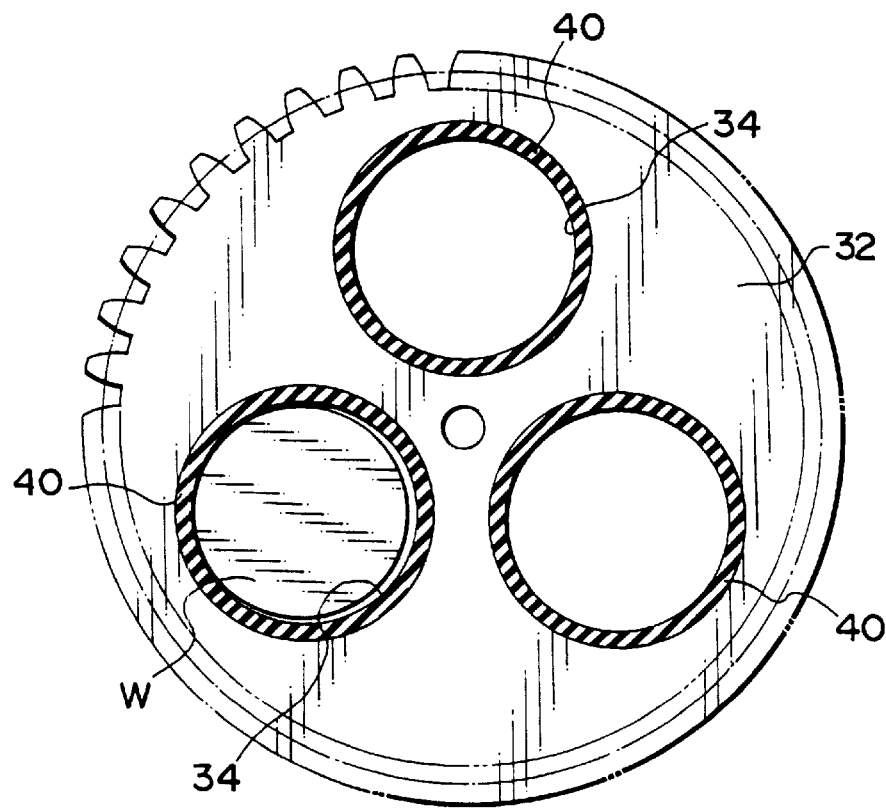
FIG. 2 is a schematic plan view of a wafer carrier used in the main part of an apparatus for double-side polishing semiconductors according to this invention.

In FIGS. 1 and 2, an annular polishing buff 40 is secured along the inner peripheral edge of a carrier hole 34, wherein the annular member 40 is a polishing buff for the edge of a semiconductor wafer. The inner peripheral edge of the annular polishing buff 40 has a sectional shape that is substantially a copy of an edge profile of a semiconductor wafer W to be polished wherein the lower part of the sectional profile of the inner peripheral edge has an extension 40a with a thickness profile of gradually tailing off toward the center of the polishing buff 40. Materials preferably used for the annular polishing buff 40 are polyurethane foam, nonwoven fabrics and fluoropolymer foam, and others which are suitable for ordinary polishing pads. The edge of the wafer W are formed of the upper and lower chamfered portions 42a, 42b and peripheral portion 42c and the three portions and the main surfaces are smoothly connected end to end to form a smoothly bending curve as a whole.

Functions of the annular polishing buff 40 on the edge of the wafer W will be described. In the course of one double-side polishing operation, the lower half of the edge 42, more particularly the lower chamfered portion 42b and part of the peripheral portion 42c, of the wafer W are polished by the contact with the inner surface of the annular polishing buff 40, since the wafer carrier 32 and the wafer W both receive directly or indirectly not only the gravitational force downwardly acting thereon but also the downward pressure from the upper polishing turn table 26, while the edge of the wafer W is rotated about its center at a relative speed to the inner peripheral edge of the carrier hole 34.

After completion of polishing the lower half of the edge 42 of the wafer W, the wafer W is turned upside down and the upper half left unpolished of the edge 42 of the wafer W is then polished in the same way as mentioned above.

In the above example, the annular polishing buff 40 is secured on the inner peripheral edge of the carrier hole 34 as a polishing buff for the wafer edge. According to this invention, another structure of the inner peripheral edge of the carrier hole 34 may be adopted as shown in FIG. 3, wherein an annular member 40 of a different material is not used and instead, the inner peripheral edge of a carrier hole 34 in itself has a sectional profile equal to that of the annular polishing buff 40 as an extension of the body of the wafer carrier 32. In this case, surface roughness of the edge 42 of the wafer W polished is somewhat inferior to that in the case of use of an annular polishing buff 40, but the roughness is still good enough to meet practical standards.

EXAMPLES 1 to 2

Polishing conditions applied to the examples 1 to 2 of this invention are described below:

The sample wafers were prepared from a silicon single crystal ingot grown in the Czochralski method according to the following steps of: slicing the ingot; chamfering the edge of each sliced wafer; lapping both main surfaces of the sliced wafer; and finally etching the lapped wafer, wherein the conductivity type of each wafer was p, the crystallographic orientation of its main surfaces was (100), and its diameter was 150 mm. The polishing pads were of polyurethane foam 60 or 80 in Asker C hardness (JIS-K-6301). Polishing agent was colloidal silica based containing alkali. The polishing load was 100 g/cm$^2$.

Figure 3:
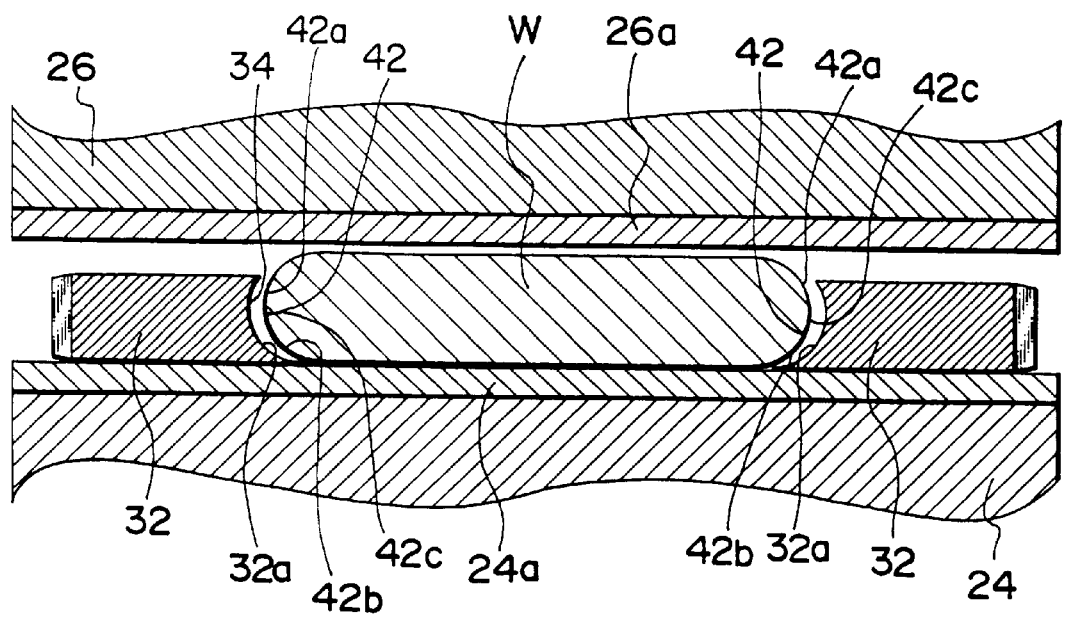
FIG. 3 is a schematic enlarged sectional view of another example of the main part of an apparatus for double-side polishing semiconductor wafers according to this invention.

The apparatus used was an apparatus for double-side polishing a semiconductor comprising the main part shown in FIGS. 1 and 3. The two surfaces of each of the sample wafers were polished at the same time by the apparatus. The results of double-side polishing showed that each of the sample wafers were practically well polished over the edge portions as well as on the two main surfaces thereof by both apparatuses. In the particular apparatus shown in FIG. 3, however, the roughness of the polished surfaces of the edge portions of each of the sample wafers was somewhat worse in the degree than that obtained by the apparatus shown in FIG. 1, but still good enough compared with the practical standards.

As clearly understood from the above description, according to the method and apparatus of this invention, firstly, production cost for a double-side polished wafer with a polished edge is decreased, and secondly, the main surfaces have almost no chance to be contaminated, since the whole edge portions of a semiconductor wafer is polished during double-side polishing and thereby such a polished wafer can be obtained in substantially one operation of polishing.

What is claimed is:

1. An apparatus for double-side polishing of semiconductor wafers, which comprises lower and upper polishing turn tables with polishing pads applied fixedly on directly opposed surfaces of the lower and upper polishing turn tables and wafer carriers disposed between opposed surfaces of the polishing pads, each wafer carrier having carrier holes in which the wafers are respectively placed, wherein the two sides of each of the wafers are polished at the same time by rotation of the lower and upper polishing turn tables, and a sectional profile of the inner peripheral edge of each of the carrier holes is substantially the same as a beveled edge of the wafers to be polished and the sectional profile is non-symmetrical in a height dimension of the wafer carrier, wherein a portion of the beveled edge of the wafers is polished during the polishing of the two sides of the wafers.

2. An apparatus for double-side polishing of semiconductor wafers according to claim 1, wherein the sectional profile of a lower part of the inner peripheral edge of the carrier holes is an extension of the body of the wafer carrier that is shaped to gradually tail off in height toward the center of the carrier holes.

3. An apparatus for double-side polishing of semiconductor wafers, which comprises lower and upper polishing turn tables with polishing pads applied fixedly on directly opposed surfaces of the lower and upper polishing turn tables and wafer carriers disposed between opposed surfaces of the polishing pads, each wafer carrier having carrier holes in which the wafers are respectively placed, wherein the two sides of each of the wafers are polished at the same time by rotation of the lower and upper polishing turn tables, and an annular polishing buff is secured along an inner peripheral edge of the carrier hole and the sectional profile of the inner peripheral edge of the annular polishing buff is substantially the same as a beveled edge of the wafers to be polished and the sectional profile is non-symmetrical in a height dimension of the wafer carrier, wherein a portion of the beveled edge of the wafers is polished by the annular polishing buff during the polishing of the two sides of the wafers.

4. An apparatus for double-side polishing of semiconductor wafers according to claim 3, wherein the sectional profile of a lower part of the inner peripheral edge of the polishing buff is shaped so as to gradually tail off in height toward the center of the carrier hole.

5. A method for double-side polishing of semiconductor wafers comprising using the apparatus according to claim 1.

6. A method for double-side polishing of semiconductor wafers comprising using the apparatus according to claim 2.

7. A method for double-side polishing of semiconductor wafers comprising using the apparatus according to claim 3.

8. A method for double-side polishing of semiconductor wafers comprising using the apparatus according to claim 4.

9. A method for double-side polishing of semiconductor wafers according to claim 5, further comprising turning each of the wafers to be polished upside down in the middle of one operation of the double-side polishing.

10. A method for double-side polishing of semiconductor wafers according to claim 6, further comprising turning each of the wafers to be polished upside down in the middle of one operation of the double-side polishing.

11. A method for double-side polishing of semiconductor wafers according to claim 7, further comprising turning each of the wafers to be polished upside down in the middle of one operation of the double-side polishing.

12. A method for double-side polishing of semiconductor wafers according to claim 8, further comprising turning each of the wafers to be polished upside down in the middle of one operation of the double-side polishing.

13. An apparatus for double-side polishing of semiconductor wafers according to claim 2, wherein the lower part of the inner peripheral edge extends inwardly closer to the center of the carrier holes than an upper part of the inner peripheral edge of the carrier holes.

14. An apparatus for double-side polishing of semiconductor wafers according to claim 4, wherein the lower part of the inner peripheral edge extends inwardly closer to the center of the carrier holes than an upper part of the inner peripheral edge of the carrier holes.

15. An apparatus for double-side polishing of semiconductor wafers according to claim 2, wherein the inner peripheral edge has a continuous curved shape.

16. An apparatus for double-side polishing of semiconductor wafers according to claim 4, wherein the inner peripheral edge has a continuous curved shape.

17. An apparatus for double-side polishing of semiconductor wafers according to claim 2, wherein a shortest distance between opposed portions of the lower part of the inner peripheral edge is less than a diameter of the wafers, and a shortest distance between opposed portions of an upper part of the inner peripheral edge is greater than the diameter of the wafers.

18. An apparatus for double-side polishing of semiconductor wafers according to claim 4, wherein a shortest distance between opposed portions of the lower part of the inner peripheral edge is less than a diameter of the wafers, and a shortest distance between opposed portions of an upper part of the inner peripheral edge is greater than the diameter of the wafers.

19. An apparatus for double-side polishing of semiconductor wafers, which comprises lower and upper polishing turn tables with polishing pads applied fixedly on directly opposed surfaces of the lower and upper polishing turn tables and wafer carriers disposed between opposed surfaces of the polishing pads, each wafer carrier having carrier holes in which the wafers are respectively placed, wherein the two sides of each of the wafers are polished at the same time by rotation of the lower and upper polishing turn tables, the inner peripheral edge of each of the carrier holes includes an upper part and a lower part and the inner peripheral edge has a sectional profile that is substantially the same as a beveled edge of the wafers to be polished, wherein substantially only one of the upper part or the lower part of the peripheral edge at once polishes the beveled edge of the wafers such that a portion of the beveled edge of the wafers is polished during the polishing of the two sides of the wafers.

20. An apparatus for double-side polishing of semiconductor wafers, which comprises lower and upper polishing turn tables with polishing pads applied fixedly on directly opposed surfaces of the lower and upper polishing turn tables and wafer carriers disposed between opposed surfaces of the polishing pads, each wafer carrier having carrier holes in which the wafers are respectively placed, wherein the two sides of each of the wafers are polished at the same time by rotation of the lower and upper polishing turn tables, and an annular polishing buff is secured along an inner peripheral edge of the carrier hole, the inner peripheral edge of each of the annular polishing buffs includes an upper part and a lower part and the inner peripheral edge has a sectional profile that is substantially the same as a beveled edge of the wafers to be polished, wherein substantially only one of the upper part or the lower part of the peripheral edge at once polishes the beveled edge of the wafers such that a portion of the beveled edge of the wafers is polished by the annular polishing buff during the polishing of the two sides of the wafers.

* * * * *